United States Patent
Wang et al.

(10) Patent No.: US 10,756,117 B2
(45) Date of Patent: Aug. 25, 2020

(54) ARRAY SUBSTRATE, METHOD FOR MANUFACTURING THE SAME AND DISPLAY PANEL

(71) Applicants: ORDOS YUANSHENG OPTOELECTRONICS CO., LTD., Ordos (CN); BOE TECHNOLOGY GROUP CO., LTD., Beijing (CN)

(72) Inventors: Chao Wang, Beijing (CN); Shengwei Zhao, Beijing (CN); Huafeng Liu, Beijing (CN); Chunxiang Nan, Beijing (CN)

(73) Assignees: ORDOS YUANSHENG OPTOELECTRONICS CO., LTD., Ordos, Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/405,990

(22) Filed: May 7, 2019

(65) Prior Publication Data

US 2020/0043954 A1  Feb. 6, 2020

(30) Foreign Application Priority Data

Aug. 1, 2018  (CN) .......................... 2018 1 0860305

(51) Int. Cl.
*H01L 27/12*  (2006.01)
*H01L 29/417*  (2006.01)
(Continued)

(52) U.S. Cl.
CPC ........ *H01L 27/1225* (2013.01); *H01L 27/127* (2013.01); *H01L 27/1262* (2013.01);
(Continued)

(58) Field of Classification Search
CPC ............. H01L 27/1225; H01L 27/1262; H01L 27/127; H01L 27/1288; H01L 27/1251;
(Continued)

(56) References Cited

U.S. PATENT DOCUMENTS

2003/0129790 A1* 7/2003 Yamazaki ........... H01L 27/3244
                                                    438/149
2004/0219723 A1* 11/2004 Peng ................... H01L 27/1214
                                                    438/166
(Continued)

FOREIGN PATENT DOCUMENTS

CN          1641450 A     7/2005
CN        103295962 A     9/2013
(Continued)

OTHER PUBLICATIONS

First Chinese Office Action dated Apr. 13, 2020, received for corresponding Chinese Application No. 201810860305.8, 18 pages.

*Primary Examiner* — Mohsen Ahmadi
(74) *Attorney, Agent, or Firm* — Kinney & Lange, P.A.

(57) ABSTRACT

An array substrate includes a display region and a peripheral circuit region surrounding the display region. The array substrate further includes: a base substrate; first TFTs arranged on a first surface of the base substrate and at the display region, and each first TFT including a first gate electrode, a first active layer and a first source-drain electrode; and second TFTs arranged on the first surface and at the peripheral circuit region, and each second TFT including a second gate electrode, a second active layer and a second source-drain electrode. The first active layer of each first TFT is made of a material different from, and arranged at a same layer as, the second active layer of each second TFT, and the first source-drain electrode is arranged at a same layer as the second source-drain electrode.

13 Claims, 9 Drawing Sheets

(51) Int. Cl.
*H01L 29/786* (2006.01)
*H01L 27/32* (2006.01)

(52) U.S. Cl.
CPC ...... *H01L 27/1288* (2013.01); *H01L 27/1214* (2013.01); *H01L 27/1222* (2013.01); *H01L 27/1248* (2013.01); *H01L 27/1251* (2013.01); *H01L 27/3262* (2013.01); *H01L 29/7869* (2013.01); *H01L 29/78696* (2013.01)

(58) Field of Classification Search
CPC ............. H01L 27/1248; H01L 27/1222; H01L 27/1214; H01L 27/3262; H01L 29/78696; H01L 29/7869
See application file for complete search history.

(56) References Cited

U.S. PATENT DOCUMENTS

| | | | | |
|---|---|---|---|---|
| 2005/0161742 A1* | 7/2005 | Isobe | ................. | H01L 21/2022 257/347 |
| 2006/0234429 A1* | 10/2006 | Oh | ...................... | H01L 27/1288 438/149 |
| 2007/0194705 A1* | 8/2007 | Sung | ................... | H01L 27/3276 313/506 |
| 2008/0179597 A1* | 7/2008 | Yamazaki | ............... | H01L 27/12 257/59 |
| 2012/0084973 A1* | 4/2012 | Wu | .................... | G02F 1/136259 29/825 |
| 2015/0179679 A1 | 6/2015 | Im | | |
| 2016/0149165 A1* | 5/2016 | Kim | ................... | H01L 51/5284 257/40 |
| 2017/0194416 A1* | 7/2017 | Chen | ................... | H01L 27/3248 |
| 2017/0307920 A1 | 10/2017 | Chung et al. | | |
| 2017/0309649 A1* | 10/2017 | Hayashi | ................... | G09F 9/30 |
| 2019/0165004 A1* | 5/2019 | Lou | ................... | H01L 27/1251 |
| 2019/0227385 A1* | 7/2019 | Ahn | .......................... | G02F 1/133617 |
| 2019/0267409 A1 | 8/2019 | Hu et al. | | |
| 2019/0278455 A1* | 9/2019 | Li | ........................... | G06F 3/041 |

FOREIGN PATENT DOCUMENTS

| | | |
|---|---|---|
| CN | 107315292 A | 11/2017 |
| CN | 107452756 A | 12/2017 |

* cited by examiner

ARRAY SUBSTRATE, METHOD FOR MANUFACTURING THE SAME AND DISPLAY PANEL

CROSS-REFERENCE TO RELATED APPLICATION

The present application claims a priority of the Chinese patent application No. 201810860305.8 filed on Aug. 1, 2018, which is incorporated herein by reference in its entirety.

TECHNICAL FIELD

The present disclosure relates to the field of display technology, in particular to an array substrate, a method for manufacturing the same, and a display panel.

BACKGROUND

In a current process for manufacturing an array substrate, an active layer at a display region is made of a material different from an active layer at a peripheral circuit region, so the manufacture process is relatively complex, the production cost is high and the production efficiency is low.

Hence, there is an urgent need to provide a scheme for improving the manufacture process for the array substrate.

SUMMARY

In one aspect, the present disclosure provides in some embodiments an array substrate, including a display region and a peripheral circuit region surrounding the display region. The array substrate further includes: a base substrate; first thin film transistors (TFTs) arranged on a first surface of the base substrate and at the display region, and each including a first gate electrode, a first active layer and a first source-drain electrode; and second TFTs arranged on the first surface and at the peripheral circuit region, and each including a second gate electrode, a second active layer and a second source-drain electrode. The first active layer of each first TFT is made of a material different from, and arranged at a same layer as, the second active layer of each second TFT, and the first source-drain electrode is arranged at a same layer as the second source-drain electrode.

In a possible embodiment of the present disclosure, the first gate electrode is arranged at a same layer as the second gate electrode.

In a possible embodiment of the present disclosure, the first active material is made of an oxide semiconductor material, and the second active layer is made of low-temperature poly-silicon.

In a possible embodiment of the present disclosure, the array substrate further includes a first insulation layer serving as a first interlayer insulation layer of each first TFT and a second interlayer insulation layer of each second TFT, and the first insulation layer being provided with first hollowed-out regions between the first TFT and the second TFT adjacent to each other, between two adjacent first TFTs or both.

In a possible embodiment of the present disclosure, the array substrate further includes a second insulation layer serving as a first gate insulation layer of the first TFT and a second gate insulation layer of the second TFT, and the second insulation layer being provided with second hollowed-out regions, wherein an orthogonal projection of each second hollowed-out region onto the base substrate overlaps an orthogonal projection of the corresponding first hollowed-out region onto the base substrate.

In another aspect, the present disclosure provides in some embodiments a method for manufacturing the above-mentioned array substrate, including forming first TFTs and second TFTs on a first surface of a base substrate, wherein each first TFT comprises a first gate electrode, a first active layer and a first source-drain electrode, each second TFT comprises a second gate electrode, a second active layer and a second source-drain electrode, and the first source-drain electrodes and the second source-drain electrodes are formed through a single patterning process.

In a possible embodiment of the present disclosure, the method includes: forming the second active layer on the first surface through a first patterning process; forming the first active layer on the first surface through a second patterning process; forming a second insulation layer covering each first active layer and each second active layer on the first surface; forming a first conductor layer at a surface of the second insulation layer away from the base substrate; patterning the first conductor layer through a third patterning process to acquire the second gate electrode and a patterned conductor layer, an orthogonal projection of the patterned conductor layer in a vertical direction covering an orthogonal projection of the display region in the vertical direction; subjecting each second active layer to doping treatment with each second gate electrode and the patterned conductor layer as a mask; and patterning the patterned conductor layer through a fourth patterning process to acquire each first gate electrode.

In a possible embodiment of the present disclosure, the method further includes: forming a first insulation layer; and forming via-holes through a single patterning process. Each first source-drain electrode is electrically connected to the corresponding first active layer through the corresponding via-hole, and each second source-drain electrode is electrically connected to the corresponding second active layer through the corresponding via-hole.

In a possible embodiment of the present disclosure, first hollowed-out regions of the first insulation layer, second hollowed-out regions of the second insulation layer and the via-holes are formed through a single patterning process.

In a possible embodiment of the present disclosure, each second active layer is made of low-temperature poly-silicon, and each first active layer is made of an oxide semiconductor material.

In yet another aspect, the present disclosure provides in some embodiments a display panel including the above-mentioned array substrate.

DETAILED DESCRIPTION OF EMBODIMENTS

The present disclosure will be described hereinafter in conjunction with the drawings and embodiments. The following embodiments are for illustrative purposes only, but shall not be used to limit the scope of the present disclosure. Where no technique or condition is specified, the known technique or condition, or that specified in a product manual, may be applied. Where no manufacturer of a reagent or instrument is specified, the market-available reagent or instrument may be applied.

Figure 1:
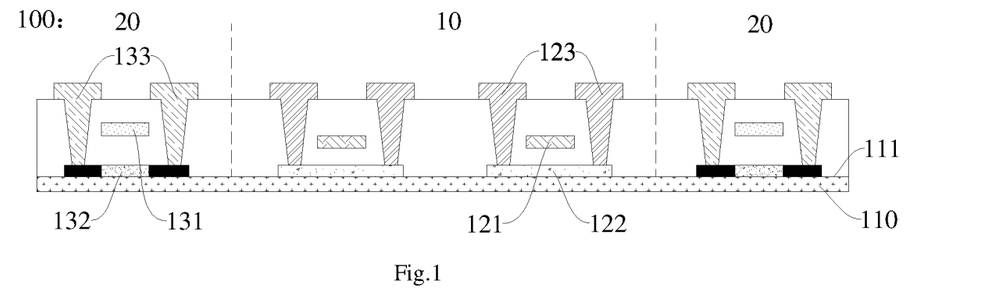
FIG. 1 is a sectional view of an array substrate according to one embodiment of the present disclosure.

The present disclosure provides in some embodiments an array substrate 100 which, as shown in FIG. 1, includes a display region 10 and a peripheral circuit region 20 surrounding the display region 10. The array substrate 100 further includes: a base substrate 110; first TFTs arranged on a first surface 111 of the base substrate 110 and at the display region 10, and each including a first gate electrode 121, a first active layer 122 and a first source-drain electrode 123; second TFTs arranged on the first surface 111 and at the peripheral circuit region 20, and each including a second gate electrode 131, a second active layer 132 and a second source-drain electrode 133 (FIG. 1 merely shows two first TFTs at an edge of the display region 10 and two second TFTs adjacent to the display region 10, but it should be appreciated that, there exist the other first TFTs arranged at the display region 10 and the other second TFTs arranged at the peripheral circuit region 20). The first active layer 122 of each first TFT is made of a material different from, and arranged at a same layer as, the second active layer 132 of each second TFT (it should be appreciated that, the first active layer 122 being arranged at the same layer as the second active layer 132 merely means that the first active layer 122 and the second active layer 123 are structurally arranged at the same layer, which may also applied to the other similar description), and the first source-drain electrode 123 is arranged at a same layer as the second source-drain electrode 133.

According to the array substrate 100 in the embodiments of the present disclosure, the first source-drain electrodes 123 are arranged at the same layer as the second source-drain electrodes 133, so during the manufacture of the array substrate 100, it is able to form the first source-drain electrodes 123 and the second source-drain electrodes 133 through a single masking process. In addition, the first active layers 122 are arranged at the same layer as the second active layers 132, so during the manufacture of the array substrate 100, it is able to form via-holes 190 in the display region 10 and the peripheral circuit region 20 through a single masking process too. As compared with the related art where it is necessary to form the via-holes in the display region and the peripheral circuit region through two masking processes and form the first source-drain electrodes and the second source-drain electrodes through two masking processes when the active layer at the display region is made of a material different from the active layer at the peripheral circuit region, it is able to reduce the number of the masking processes, thereby to simplify the entire manufacture process, reduce the manufacture cost, improve the production efficiency, and facilitate the massive production.

In a possible embodiment of the present disclosure, the first active layer 122 may be made of an oxide semiconductor material, and the second active layer 132 may be made of low-temperature poly-silicon. On one hand, low-temperature poly-silicon has high electron mobility, so it is able to provide each second TFT at the peripheral circuit region 20 of the array substrate 100 with excellent electrical stability, thereby to provide a narrower peripheral circuit region and reduce the manufacture cost. In addition, it is able to provide a light and thin second TFT, reduce a size of the second TFT, and reduce the power consumption, thereby to provide the array substrate 100 with a larger aperture ratio when it is applied to a liquid crystal display panel, and enable the liquid crystal display panel to display an image at a large brightness value and in a large color gamut in the case of no change in a backlight source. On the other hand, the oxide semiconductor material has a relatively large energy gap as well as relatively high electron mobility, so it is able to provide a relatively high Pixel Per Inch (PPI) and a relatively large aperture ratio when the array substrate 100 is applied to transparent display devices in various sizes. Each first TFT at the display region 10 has a relatively low off-state current, so it is able to apply the array substrate to a product driven at a low frequency, thereby to further reduce the power consumption and prevent the occurrence of flickering and crosstalk. In a word, when the first active layer 122 is made of the oxide semiconductor material and the second active layer 132 is made of low-temperature poly-silicon, it is able to provide each of the first TFTs and the second TFTs with optimum performance.

In the embodiments of the present disclosure, a size and a thickness of the array substrate 100, as well as a size and a thickness of each layer structure of the array substrate 100 (e.g., the first gate electrode 121, the first active layer 122, the first source-drain electrode 123, the second gate electrode 131, the second active layer 132 and the second source-drain electrode 133), may be known in the art, and a material of each of the first gate electrode 121, the first source-drain electrode 123, the second gate electrode 131 and the second source-drain electrode 133 may be known in the art, which will thus not be particularly defined herein.

Figure 2:
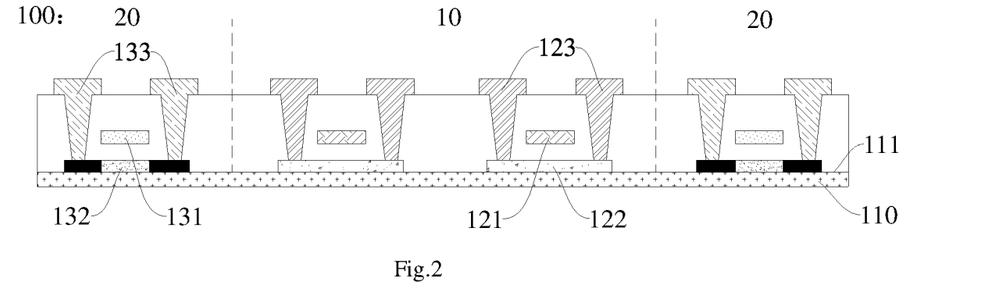
FIG. 2 is another sectional view of the array substrate according to one embodiment of the present disclosure.

As shown in FIG. 2, in a possible embodiment of the present disclosure, the first gate electrodes 121 may be arranged at the same layer as the second gate electrodes 131, so that thickness of the array substrate 100 is smaller as compared with the situation that the first gate electrode 121 and the second gate electrode 131 are arranged at different layers, simplify the manufacture process, and facilitate the massive production.

Figure 3A:
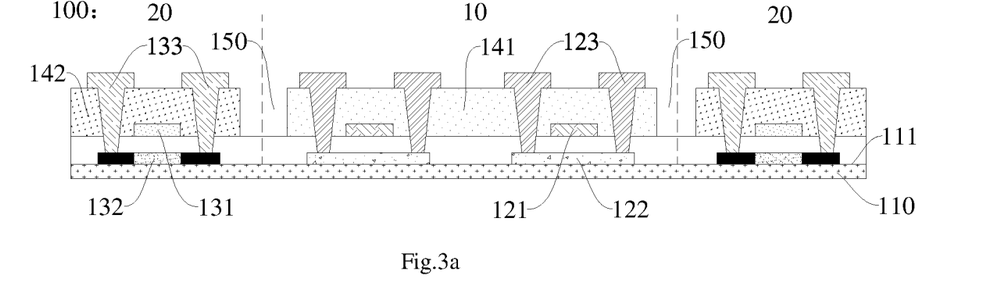
FIGS. 3a, 3b and 3c are sectional views of the array substrate according to one embodiment of the present disclosure.
Figure 3B:
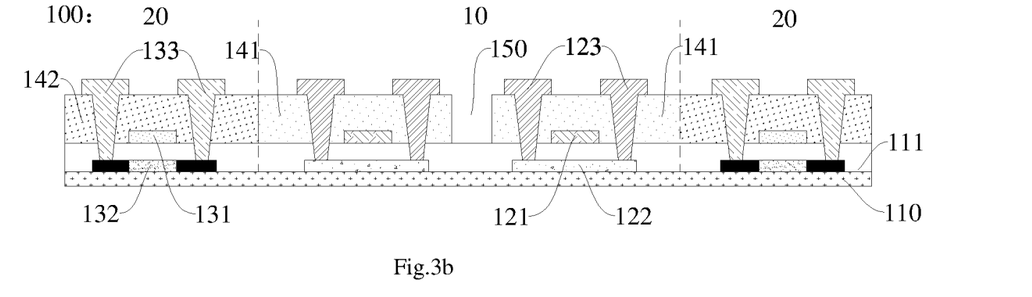
Figure 3C:
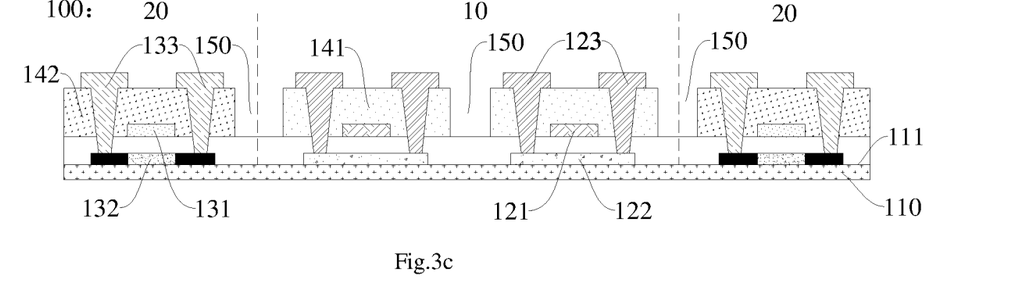

As shown in FIGS. 3a, 3b and 3c, the array substrate 100 may further include a first insulation layer consisting of a first interlayer insulation layer 141 of the first TFT and a second interlayer insulation layer 142 of the second TFT, and the first insulation layer is provided with a first hollowed-out region 150 between the first TFT and the second TFT adjacent to each other (as shown in FIG. 3a), or between two adjacent first TFTs (as shown in FIG. 3b), or both (as shown in FIG. 3c). On one hand, when the first active layer 122 or the second active layer 132 is made of the oxide semiconductor material, it is able to reduce the number of free hydrogen atoms moving from the first interlayer insulation layer 141 and the second interlayer insulation layer 142 to the first active layer 122 or the second active layer 132 during the manufacture of the array substrate 100, thereby to improve the performance of the first active layer 122 and the second active layer 132. On the other hand, due to the first hollowed-out regions 150 of the first insulation layer, it is able to provide the array substrate 100 with excellent transmissivity.

Figure 4A:
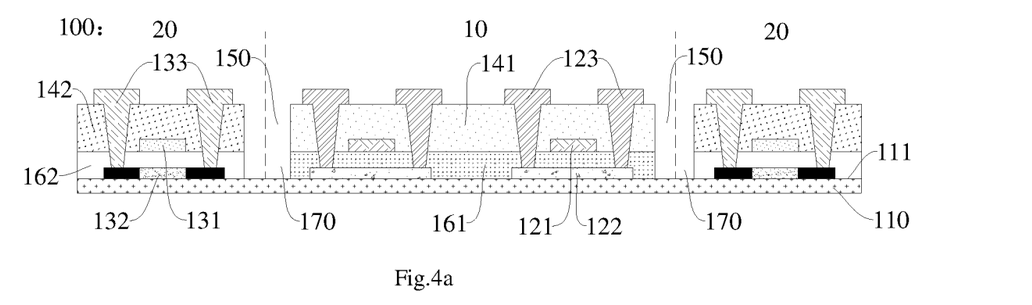
FIGS. 4a, 4b and 4c are sectional views of the array substrate according to one embodiment of the present disclosure.
Figure 4B:
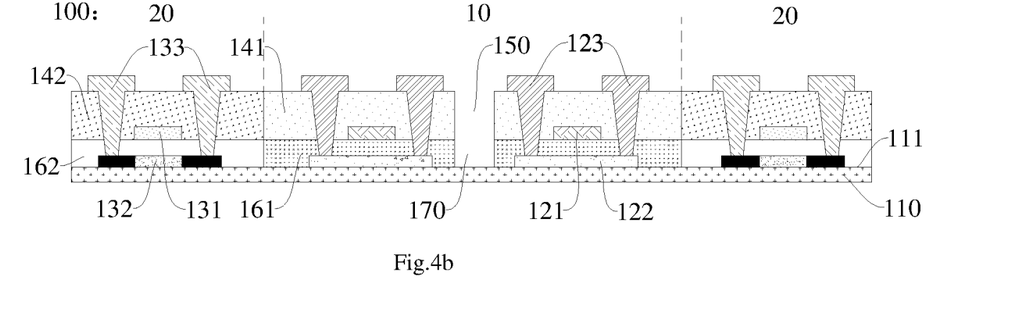
Figure 4C:
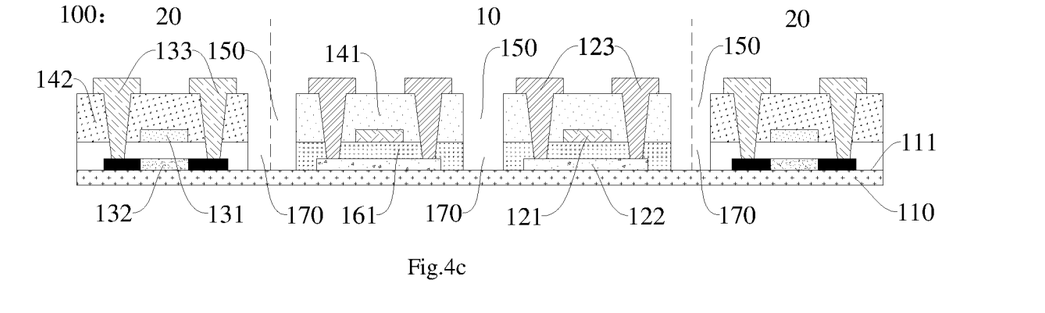
Figure 5:
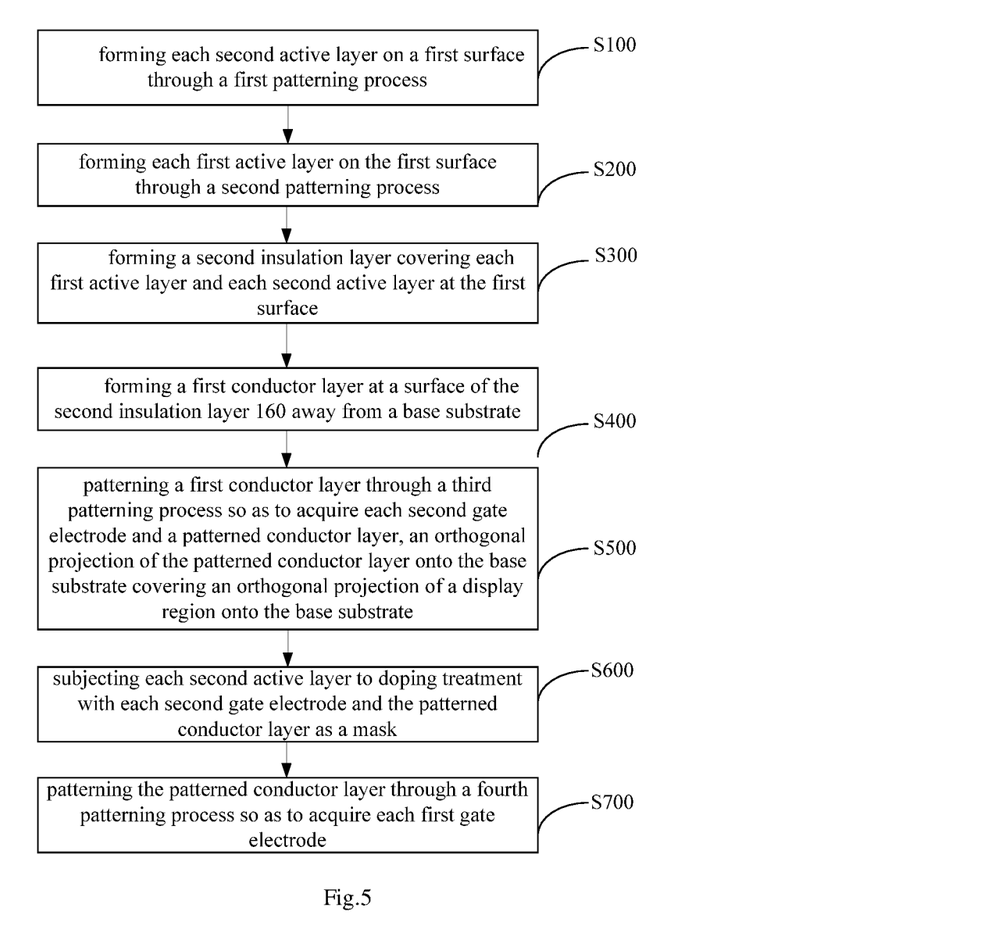
FIG. 5 is a flow chart of a method for manufacturing the array substrate according to one embodiment of the present disclosure.

As shown in FIGS. 4a, 4b and 4c, the array substrate 100 may further include a second insulation layer consisting of a first gate insulation layer 161 of the first TFT and a second gate insulation layer 162 of the second TFT, and the second insulation layer is provided with second hollowed-out regions 170. An orthogonal projection of each second hollowed-out region 170 onto the base substrate 110 may overlap an orthogonal projection of the corresponding first hollowed-out region 150 onto the base substrate 110 (it should be appreciated that, in FIGS. 41, 4b, 4c, 10a and 10b, each first hollowed-out region 150 is arranged at a same level as the first insulation layer 140 (or the first interlayer insulation layer 141 and the second interlayer insulation layer 142), and each second hollowed-out region 170 is arranged at a same level as the second insulation layer 160 (or the first gate insulation layer 161 and the second gate insulation layer 162)). Corresponding to FIGS. 3a, 3b and 3c, the orthogonal projection of each second hollowed-out region 170 onto the base substrate 110 may merely overlap the orthogonal projection of the corresponding first hollowed-out region 150 arranged between the first TFT and the adjacent second TFT onto the base substrate 110 (as shown in FIG. 4a), or the orthogonal projection of the corresponding first hollowed-out region 150 arranged between two adjacent second TFTs onto the base substrate 110 (as shown in FIG. 4b), or both (as shown in FIG. 4c). On one hand, it is able to simplify the manufacture process of the array substrate 100, reduce the manufacture cost, and facilitate the massive production. In addition, when the first active layer 122 or the second active layer 132 is made of the oxide semiconductor material, it is able to further reduce the number of free hydrogen atoms moving from the first gate insulation layer 161 and the second gate insulation layer 162 to the first active layer 122 or the second active layer 132 during the manufacture of the array substrate 100, thereby to further improve the performance of the first active layer 122 and the second active layer 132 of the array substrate 100. On the other hand, when the orthogonal projection of each second hollowed-out region 170 onto the base substrate 110 overlaps the orthogonal projection of the corresponding first hollowed-out region 150 onto the base substrate 110, it is able to form the first hollowed-out regions 150, the second hollowed-out regions 170 and the via-holes 190 through a single patterning process, thereby to simplify the manufacture process without adding the number of masks. Furthermore, due to the second hollowed-out regions 170 of the second insulation layer, it is able to further improve the transmissivity of the array substrate 100.

The present disclosure further provides in some embodiments a method for manufacturing the above-mentioned array substrate 100, which includes forming the first TFTs and the second TFTs on the first surface 111 of the base substrate 110. Each first TFT includes the first gate electrode 121, the first active layer 122 and the first source-drain electrode 123, each second TFT includes the second gate electrode 131, the second active layer 132 and the second source-drain electrode 133, and the first source-drain electrodes 123 and the second source-drain electrodes 133 are formed through a single patterning process (as shown in FIGS. 1 and 2). According to the method in the embodiments of the present disclosure, the first source-drain electrodes 123 and the second source-drain electrodes 133 may be formed through a single patterning process, so it is able to form the via-holes in the display region 10 and the peripheral circuit region 20 through a single patterning process too. As compared with the related art where it is necessary to form the via-holes in the display region and the peripheral circuit region through two masking processes and form the first source-drain electrodes and the second source-drain electrodes through two masking processes when the active layer at the display region is made of a material different from the active layer at the peripheral circuit region, it is able to reduce the number of the masking processes, thereby to simplify the entire manufacture process, reduce the manufacture cost, improve the production efficiency, and facilitate the massive production.

As shown in FIGS. 5, 6a, 6b, 6c, 6d, 6e, 6f and 6g, the method may further include the following steps.

Figure 6A:
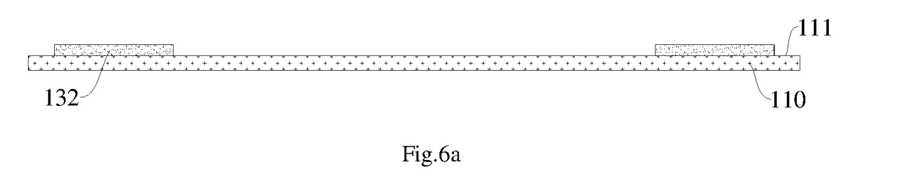
FIGS. 6a, 6b, 6c, 6d, 6e, 6f and 6g are schematic views showing the manufacture of the array substrate according to one embodiment of the present disclosure.

S100: forming each second active layer 132 on the first surface 11 through a first patterning process (as shown in FIG. 6a).

In the embodiments of the present disclosure, the first patterning process may include forming a layer at the first surface 111 of the base substrate 110, coating a photoresist onto the layer, exposing and developing the photoresist, etching the layer, and removing the photoresist, so as to acquire the second active layer 132. Process parameters of the first patterning process are known in the art, and thus will not be particularly defined herein. Therefore, the entire manufacture process is simplified, the manufacture cost is reduced, the production efficiency is improved, and the massive production is facilitated.

Figure 6B:
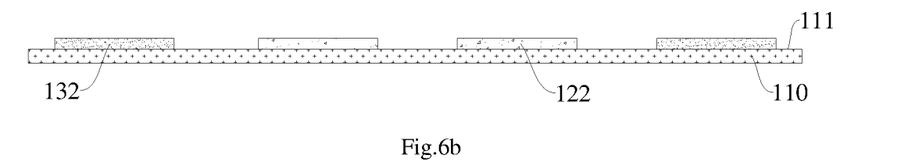

S200: forming each first active layer 122 on the first surface 111 through a second patterning process (as shown in FIG. 6b).

In the embodiments of the present disclosure, the second patterning process may include forming a layer at the first surface 111 of the base substrate 110, coating a photoresist onto the layer, exposing and developing the photoresist, etching the layer, and removing the photoresist, so as to acquire the first active layer 122. Process parameters of the second patterning process are known in the art, and thus will not be particularly defined herein. Therefore, the entire manufacture process is simplified, the manufacture cost is reduced, the production efficiency is improved, and the massive production is facilitated.

Figure 6C:
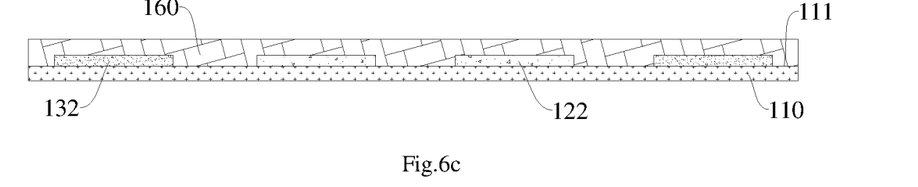

S300: forming the second insulation layer 160 covering each first active layer 122 and each second active layer 132 on the first surface 111 (as shown in FIG. 6c).

In the embodiments of the present disclosure, the second insulation layer 160 may be formed through a vacuum evaporation, chemical vapor deposition, spinning or ink-jet printing process. Process parameters of these processes are known in the art, and thus will not be particularly defined herein. Therefore, the entire manufacture process is simplified, the manufacture cost is reduced, the production efficiency is improved, and the massive production is facilitated.

Figure 6D:
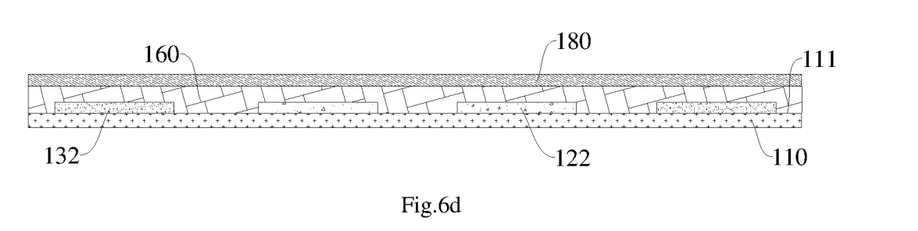

S400: forming a first conductor layer 180 on a surface of the second insulation layer 160 away from the base substrate 110 (as shown in FIG. 6d).

In the embodiments of the present disclosure, the first conductor layer 180 may be formed through a vacuum evaporation, chemical vapor deposition, spinning or ink-jet printing process. Process parameters of these processes are known in the art, and thus will not be particularly defined herein. Therefore, the entire manufacture process is simplified, the manufacture cost is reduced, the production efficiency is improved, and the massive production is facilitated.

Figure 6E:
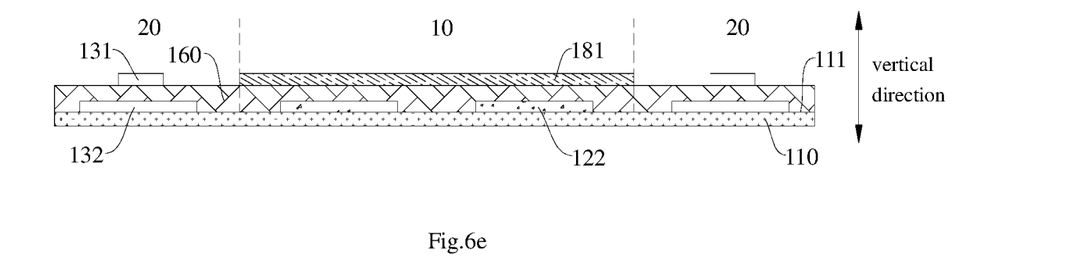

S500: patterning the first conductor layer 180 through a third patterning process so as to acquire each second gate electrode 131 and a patterned conductor layer 181. An orthogonal projection of the patterned conductor layer 181 in a vertical direction may cover an orthogonal projection of the display region 10 in the vertical direction (as shown in FIG. 6e).

In the embodiments of the present disclosure, the third patterning process may include coating a photoresist on a surface of the first conductor layer 180, exposing and developing the photoresist, etching and removing the photoresist, so as to acquire each second gate electrode 131 and the patterned conductor layer 181. Process parameters of the third patterning process are known in the art, and thus will not be particularly defined herein. Therefore, the entire manufacture process is simplified, the manufacture cost is reduced, the production efficiency is improved, and the massive production is facilitated.

Figure 6F:
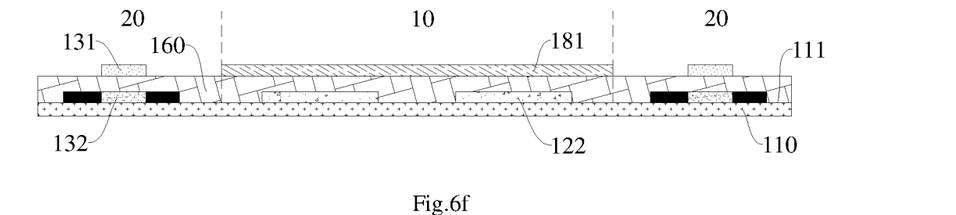

S600: subjecting each second active layer 132 to doping treatment with each second gate electrode 131 and the patterned conductor layer 181 as a mask (as shown in FIG. 6f).

In the embodiments of the present disclosure, the doping treatment may include high-temperature diffusion or ion implantation. Process parameters of the high-temperature diffusion or ion implantation are known in the art, and thus will not be particularly defined herein. Due to the use of each second gate electrode 131 and the patterned conductor layer 181 as the mask, when the second active layer 132 is made of low-temperature poly-silicon and the first active layer 122 is made of the oxide semiconductor material, it is able to prevent ions from entering the first active layer 122 during the doping treatment on the second active layer 132, thereby to improve the performance of the first TFTs at the display region 10 and the second TFTs at the peripheral circuit region 20.

Figure 6G:
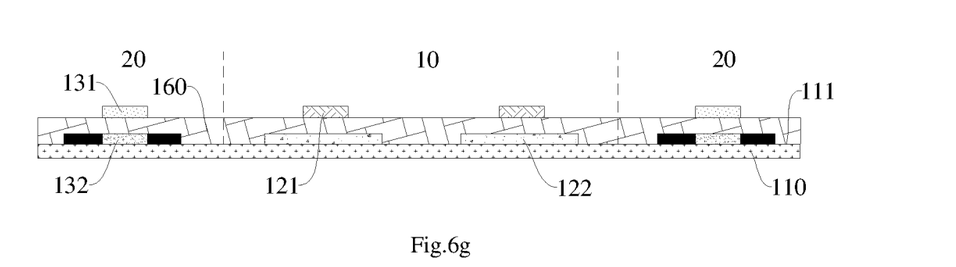

S700: patterning the patterned conductor layer 181 through a fourth patterning process so as to acquire each first gate electrode 121 (as shown in FIG. 6g).

In the embodiments of the present disclosure, the fourth patterning process may include coating a photoresist on a surface of the patterned conductor layer 181, exposing and developing the photoresist, etching and removing the photoresist, so as to acquire the first gate electrode 121. Process parameters of the fourth patterning process are known in the art, and thus will not be particularly defined herein. Therefore, the entire manufacture process is simplified, the manufacture cost is reduced, the production efficiency is improved, and the massive production is facilitated.

Figure 7:
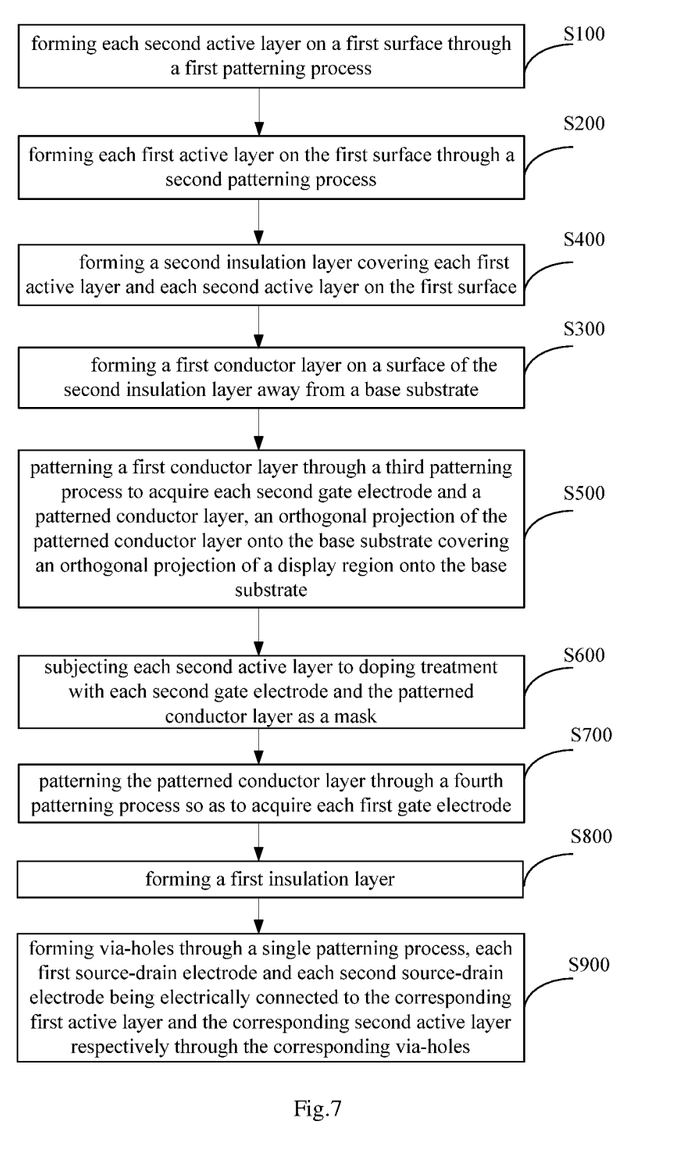
FIG. 7 is a flow chart of the method for manufacturing the array substrate according to one embodiment of the present disclosure.
Figure 8A:
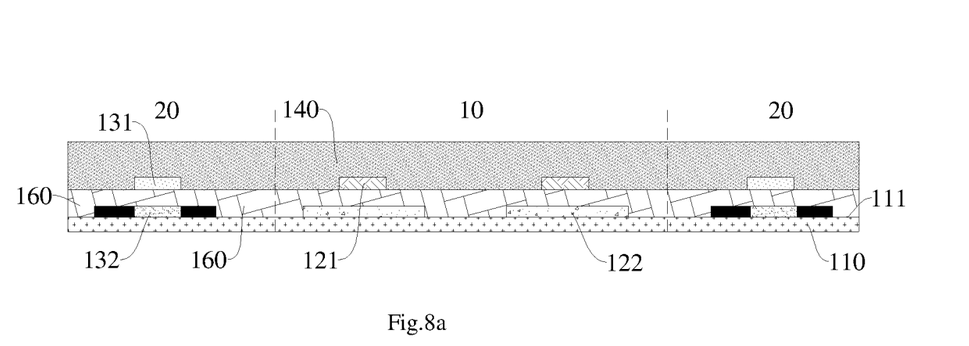
FIGS. 8a, 8b and 8c are schematic views showing the manufacture of the array substrate according to one embodiment of the present disclosure.
Figure 8B:
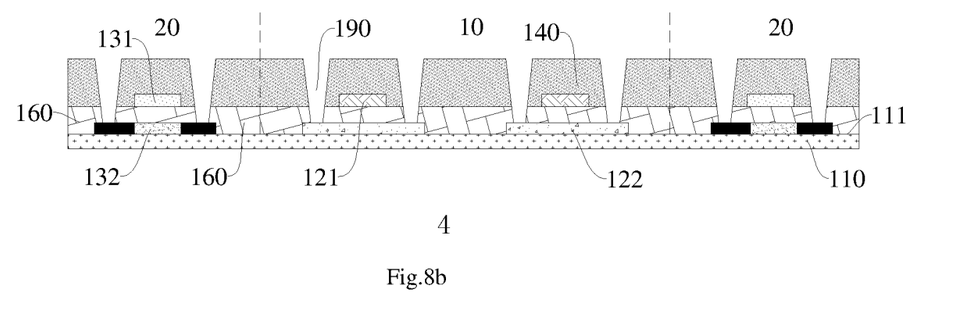

As shown in FIGS. 7, 8a and 8b, the method may further include the following steps.

S800: forming the first insulation layer 140 (as shown in FIG. 8a).

In the embodiments of the present disclosure, the first insulation layer 140 may be formed through a vacuum evaporation, chemical vapor deposition, spinning or ink-jet printing process. Process parameters of these processes are known in the art, and thus will not be particularly defined herein. Therefore, the entire manufacture process is simplified, the manufacture cost is reduced, the production efficiency is improved, and the massive production is facilitated.

Figure 8C:
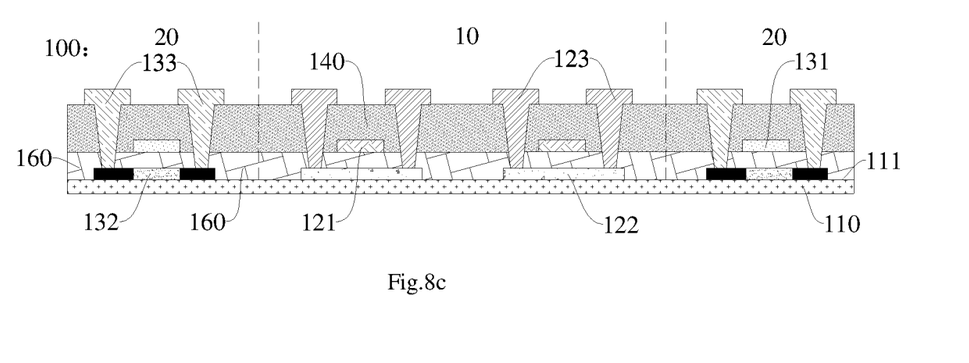

S900: forming the via-holes 190 through a single patterning process (as shown in FIG. 8b). Each first source-drain electrode 123 may be electrically connected to the corresponding first active layer 122 through the corresponding via-hole 190, and each second source-drain electrode 133 may be electrically connected to the corresponding second active layer 132 through the corresponding via-hole 190 (as shown in FIG. 8c).

In the embodiments of the present disclosure, the patterning process may include coating a photoresist onto a surface of the second insulation layer 160, exposing and developing the photoresist, etching and removing the photoresist, so as to acquire the via-holes 190. Process parameters of the patterning process are known in the art, and thus will not be particularly defined herein. Therefore, the entire manufacture process is simplified, the manufacture cost is reduced, the production efficiency is improved, and the massive production is facilitated.

In the embodiments of the present disclosure, the via-holes 190 may be formed in the display region 10 and the peripheral circuit region 20 merely through a single patterning process. As compared with the related art where the via-holes are formed in the display region and the peripheral circuit region through two masking processes when the active layer at the display region is made of a material different from the active layer at the peripheral circuit region, it is able to reduce one masking process, thereby to simplify the manufacture process, reduce the manufacture cost, improve the production tact, and facilitate the massive production.

In the embodiments of the present disclosure, after the formation of the via-holes 190 through a single patterning process, each first source-drain electrode 123 may be electrically connected to the corresponding first active layer 122 through the corresponding via-hole 190, and each second source-drain electrode 133 may be electrically connected to the corresponding second active layer 132 through the corresponding via-hole 190, so it is able to simplify the manufacture process, reduce the manufacture cost, improve the production tact, and facilitate the massive production.

It should be appreciated that, in the embodiments of the present disclosure, the processes, steps, conditions and parameters in S100 to S700 are the same as those mentioned above, and thus will not be particularly defined herein.

Figure 9:
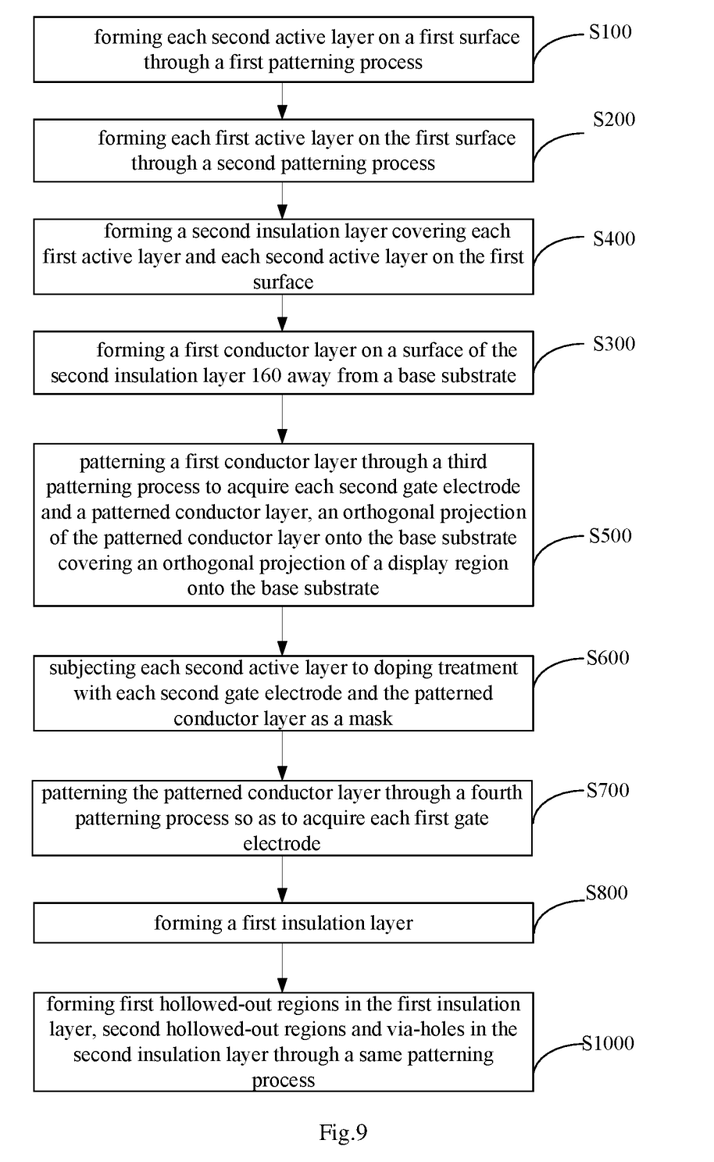
FIG. 9 is another flow chart of the method for manufacturing the array substrate according to one embodiment of the present disclosure.
Figure 10A:
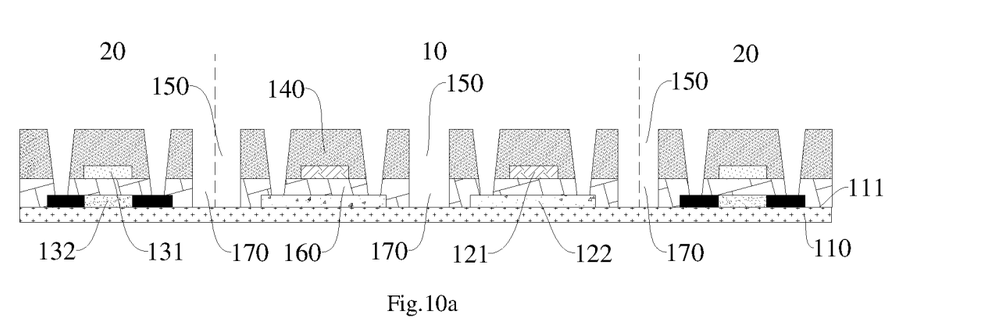
FIGS. 10a and 10b are schematic views showing the manufacture of the array substrate according to one embodiment of the present disclosure.
Figure 10B:
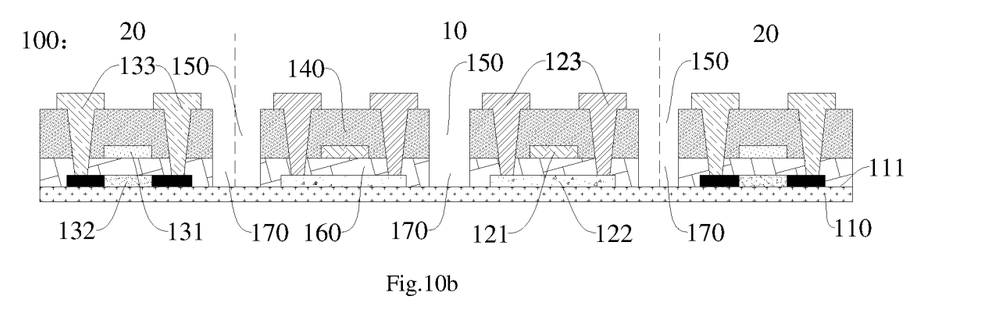

As shown in FIGS. 9, 10a and 10b, the method may further include the following steps.

S1000: forming the first hollowed-out regions 150 in the first insulation layer 140, the second hollowed-out regions 170 in the second insulation layer 160 and the via-holes 190 through a same patterning process (as shown in FIG. 10a).

In the embodiments of the present disclosure, the patterning process may include coating a photoresist onto a surface of the second insulation layer 160, exposing and developing the photoresist, etching and removing the photoresist, so as to acquire the first insulation layer 140, the first hollowed-out regions 150, the second hollowed-out regions 170 and the via-holes 190. Process parameters of the patterning process are known in the art, and thus will not be particularly defined herein. Therefore, the entire manufacture process is simplified, the manufacture cost is reduced, the production efficiency is improved, and the massive production is facilitated.

In the embodiments of the present disclosure, after the formation of the first hollowed-out regions 150 of the first insulation layer 140, the second hollowed-out regions 170 of the second insulation layer 160 and the via-holes 190 through a single patterning process, the first source-drain electrodes 123 and the second source-drain electrodes 133 may be formed, each first source-drain electrode 123 may be electrically connected to the corresponding first active layer 122 through the corresponding via-hole 190, and each second source-drain electrode 133 may be electrically connected to the corresponding second active layer 132 through the corresponding via-hole 190 (as shown in FIG. 10b). As a result, it is able to simplify the manufacture process, reduce the manufacture cost, improve the production tact, and facilitate the massive production.

In the embodiments of the present disclosure, the via-holes 190 in the display region 10 and the peripheral region 20, the first source-drain electrode 123 and the second source-drain electrode 133, the first hollowed-out regions 150 of the first insulation layer 140 and the second hollowed-out region 170 of the second insulation layer 160 may be all formed merely through a single patterning process. As compared with the related art where the via-holes are formed through two masking processes and the first source-drain electrodes and the second source-drain electrodes are also formed through two masking processes when the active layer at the display region is made of a material different from the active layer at the peripheral circuit region, it is able to reduce the number of the masking processes, thereby to simplify the manufacture process, reduce the manufacture cost, improve the production efficiency and facilitate the massive production. In addition, due to the first hollowed-out regions 150 and the second hollowed-out regions 170, it is able to improve the performance of the first TFTs at the display region 10 and the second TFTs at the peripheral circuit region 20.

It should be appreciated that, in the embodiments of the present disclosure, the processes, steps, conditions and parameters in S100 to S800 are the same as those mentioned above, and thus will not be particularly defined herein.

The present disclosure further provides in some embodiments a display panel, which includes the above-mentioned array substrate. The implementation of the display panel may refer to that of the array substrate mentioned hereinabove with a same technical effect, and thus will not be particularly defined herein.

In the embodiments of the present disclosure, apart from the array substrate, the display panel may further include any other necessary structures, e.g., a color filter substrate and a housing, which will not be particularly defined herein.

In the embodiments of the present disclosure, such words as "in the middle of", "longitudinal", "lateral", "length", "width", "thickness", "on/above", "under/below", "front", "back", "left", "right", "vertical", "horizontal", "top", "bottom", "inside", "outside", "clockwise", "counter-clockwise", "axial", "radial" and "circumferential" may be used to indicate directions or positions as viewed in the drawings, and they are merely used to facilitate the description in the present disclosure, rather than to indicate or imply that a device or member must be arranged or operated at a specific position.

In addition, such words as "first" and "second" are merely used to differentiate different components rather than to represent any order, number or importance, i.e., they are used to implicitly or explicitly indicate that there is at least one component. Further, such a phrase as "a plurality of" is used to indicate that there are at least two, e.g., two or three, components, unless otherwise specified.

Unless otherwise defined, when one member is arranged on or under another member, the member may be in contact with the other member directly or via an intermediate member. In addition, when one member is arranged on/above another member, the member may be arranged right on/above the other member or not, or it merely means that the member is located at a level higher than the other member. When one member is arranged under/below another member, the member may be arranged right under/below the other member or not, or it merely means that the member is located at a level lower than the other member.

It should be further appreciated that, such phrases as "one embodiment" and "one of the embodiments" intend to indicate that the features, structures, materials or characteristics are contained in at least one embodiment of the present disclosure, rather than referring to a same embodiment. In addition, the features, structures, materials or characteristics may be combined in any embodiment or embodiments in an appropriate manner in the case of no conflict.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An array substrate, comprising a display region and a peripheral circuit region surrounding the display region on opposite sides of the display region, wherein the array substrate further comprises:
   a base substrate;
   a plurality of first thin film transistors (TFTs) arranged on a first surface of the base substrate and at the display region, each first TFT comprising a first gate electrode, a first active layer and a first source-drain electrode;
   a plurality of second thin film transistors (TFTs) arranged on the first surface of the base substrate and at the peripheral circuit region, each second TFT comprising a second gate electrode, a second active layer and a second source-drain electrode;
   a first insulation layer serving as a first interlayer insulation layer of each first TFT and a second interlayer insulation layer of each second TFT, the first insulation layer being provided with first hollowed-out regions between the first TFT and the second TFT adjacent to each other; and
   a second insulation layer serving as a first gate insulation layer of the first TFT and a second gate insulation layer of the second TFT, the second insulation layer being provided with second hollowed-out regions, wherein an orthogonal projection of each second hollowed-out region onto the base substrate overlaps an orthogonal projection of a corresponding first hollowed-out region onto the base substrate,
   wherein the first active layer of the first TFT is made of a material different from, and arranged at a same layer as, the second active layer of the second TFT, and the first source-drain electrode is arranged at a same layer as the second source-drain electrode.

2. The array substrate according to claim 1, wherein the first gate electrode is arranged at a same layer as the second gate electrode.

3. The array substrate according to claim 1, wherein the first active layer is made of an oxide semiconductor material, and the second active layer is made of low-temperature poly-silicon.

4. The array substrate according to claim 1, further comprising a first insulation layer serving as a first interlayer insulation layer of the first TFT and a second interlayer insulation layer of the second TFT, the first insulation layer being provided with first hollowed-out regions between two adjacent first TFTs.

5. The array substrate according to claim 4, further comprising a second insulation layer serving as a first gate insulation layer of the first TFT and a second gate insulation layer of the second TFT, the second insulation layer provided with second hollowed-out regions, wherein an orthogonal projection of each second hollowed-out region onto the base substrate overlaps an orthogonal projection of a corresponding first hollowed-out region onto the base substrate.

6. The array substrate according to claim 1, further comprising a first insulation layer serving as a first interlayer insulation layer of the first TFT and a second interlayer insulation layer of the second TFT, the first insulation layer being provided with a first hollowed-out region between the first TFT and the second TFT adjacent to each other and between two adjacent first TFTs.

7. The array substrate according to claim 6, further comprising a second insulation layer serving as a first gate insulation layer of the first TFT and a second gate insulation layer of the second TFT, the second insulation layer being provided with second hollowed-out regions, wherein an orthogonal projection of each second hollowed-out region onto the base substrate overlaps an orthogonal projection of a corresponding first hollowed-out region onto the base substrate.

8. A method for manufacturing the array substrate according to claim 1, comprising forming the first TFTs and the second TFTs on the first surface of the base substrate, wherein each first TFT comprises the first gate electrode, the first active layer and the first source-drain electrode, each second TFT comprises the second gate electrode, the second active layer and the second source-drain electrode, and the first source-drain electrodes and the second source-drain electrodes are formed through a single patterning process.

9. The method according to claim 8, comprising:
forming the second active layer on the first surface through a first patterning process;
forming the first active layer on the first surface through a second patterning process;
forming a second insulation layer covering the first active layer and the second active layer on the first surface;
forming a first conductor layer on a surface of the second insulation layer away from the base substrate;
patterning the first conductor layer through a third patterning process to form the second gate electrode and a patterned conductor layer, an orthogonal projection of the patterned conductor layer in a vertical direction covering an orthogonal projection of the display region in the vertical direction;
subjecting the second active layer to doping treatment with the second gate electrode and the patterned conductor layer as a mask; and
patterning the patterned conductor layer through a fourth patterning process to form the first gate electrode.

10. The method according to claim 9, further comprising:
forming a first insulation layer; and
forming via-holes through a single patterning process,
wherein the first source-drain electrode is electrically connected to the first active layer through a corresponding via-hole, and the second source-drain electrode is electrically connected to the second active layer through a corresponding via-hole.

11. The method according to claim 10, wherein first hollowed-out regions of the first insulation layer, second hollowed-out regions of the second insulation layer and the via-holes are formed through a single patterning process.

12. The method according to claim 9, wherein the second active layer is made of low-temperature poly-silicon, and the first active layer is made of an oxide semiconductor material.

13. A display panel, comprising the array substrate according to claim 1.

* * * * *